(12) United States Patent  
Cheong et al.

(10) Patent No.: US 7,989,286 B2
(45) Date of Patent: Aug. 2, 2011

(54) ELECTRONIC DEVICES USING CARBON NANOTUBES HAVING VERTICAL STRUCTURE AND THE MANUFACTURING METHOD THEREOF

(75) Inventors: Woo Seok Cheong, Daejeon (KR); Jin Ho Lee, Daejon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 57 days.

(21) Appl. No.: 12/517,803

(22) PCT Filed: Nov. 27, 2007

(86) PCT No.: PCT/KR2007/006028
§ 371 (c)(1), (2), (4) Date: Jun. 4, 2009

(87) PCT Pub. No.: WO2008/069485
PCT Pub. Date: Jun. 12, 2008

(65) Prior Publication Data
US 2010/0096619 A1  Apr. 22, 2010

(30) Foreign Application Priority Data

Dec. 5, 2006  (KR) .................. 10-2006-0122354
Jun. 12, 2007  (KR) .................. 10-2007-0057150

(51) Int. Cl.
H01L 21/8242  (2006.01)
(52) U.S. Cl. ...................................... 438/243
(58) Field of Classification Search .......... None
See application file for complete search history.

(56) References Cited

U.S. PATENT DOCUMENTS

| 6,566,704 B2 | 5/2003 | Choi et al. |
| 6,930,343 B2 | 8/2005 | Choi et al. |
| 7,466,523 B1 * | 12/2008 | Chen .................. 360/324.1 |
| 2005/0167655 A1 | 8/2005 | Furukawa et al. |
| 2006/0249726 A1 | 11/2006 | Choi et al. |
| 2007/0024180 A1 * | 2/2007 | Choi et al. .............. 313/498 |
| 2007/0148857 A1 * | 6/2007 | Ban et al. .............. 438/243 |
| 2007/0287350 A1 * | 12/2007 | Zheng et al. ........... 445/24 |

FOREIGN PATENT DOCUMENTS

| JP | 2004-103802 | 4/2004 |
| KR | 2002-0001260 | 1/2002 |
| KR | 2004-0077000 | 9/2004 |
| KR | 2004-0107874 | 12/2004 |
| KR | 2006-0037561 | 5/2006 |

* cited by examiner

*Primary Examiner* — Charles Garber
*Assistant Examiner* — Andre' C Stevenson
(74) *Attorney, Agent, or Firm* — Rabin & Berdo, P.C.

(57) ABSTRACT

Provided are an electronic device to which vertical carbon nanotubes (CNTs) are applied and a method of manufacturing the same. The method of manufacturing an electronic device having a vertical CNT includes the steps of: (a) preparing a substrate on which a silicon source is formed; (b) forming a first insulating layer on the substrate, and etching the first insulating layer such that a top surface of the silicon source is exposed; (c) forming a second insulating layer on the silicon source, and forming a gate by patterning the second insulating layer; (d) forming a third insulating layer on the gate, and forming a through hole in which a carbon nanotube channel is to be formed by etching the third insulating layer and the second insulating layer; (e) forming a fourth insulating layer surrounding the gate on the through hole and the third insulating layer, and forming a spacer by etching the fourth insulating layer; (f) forming a metal catalyst on the silicon source; (g) vertically growing the carbon nanotube channel on the silicon source using the metal catalyst; (h) forming a fifth insulating layer on the through hole in which the carbon nanotube is formed and the third insulating layer; and (i) patterning the fifth insulating layer such that the carbon nanotube channel is exposed, and forming a silicon drain. An arrangement problem of horizontal CNTs can be solved by applying vertical CNTs and a selective silicon growth technique.

19 Claims, 7 Drawing Sheets

ELECTRONIC DEVICES USING CARBON NANOTUBES HAVING VERTICAL STRUCTURE AND THE MANUFACTURING METHOD THEREOF

TECHNICAL FIELD

The present invention relates to a method of manufacturing an electronic device using carbon nanotubes (CNTs), and more particularly, to a method of manufacturing an electronic device having a vertical CNT channel grown by a selective vertical growth technique.

The present invention has been produced from the work supported by the IT R&D program of MIC (Ministry of Information and Communication)/IITA (Institute for Information Technology Advancement) [2005-S-073-02, Development of semiconductor circuit design based on the nano-scaled device] in Korea.

BACKGROUND ART

Recently developed electronic devices based on silicon have decreased in size to several tens of nm. As the sizes of electronic devices decrease, it becomes more difficult to flow sufficient current through a conventional silicon channel, and so the channel has to be highly doped to increase current density, which is also difficult. Accordingly, to manufacture electronic devices which do not need channel doping and can be operated at a low current, horizontal CNTs of less than several tens of nm in diameter have recently been applied to a channel of an ultra-fine electronic device. Generally, CNTs exhibit metallic or semiconductor characteristics depending on contact condition, and thus an electronic device having a horizontal CNT channel employs CNTs having semiconductor characteristics.

An electronic device using conventional CNTs will now be described with reference to FIG. 1.

Figure 1:
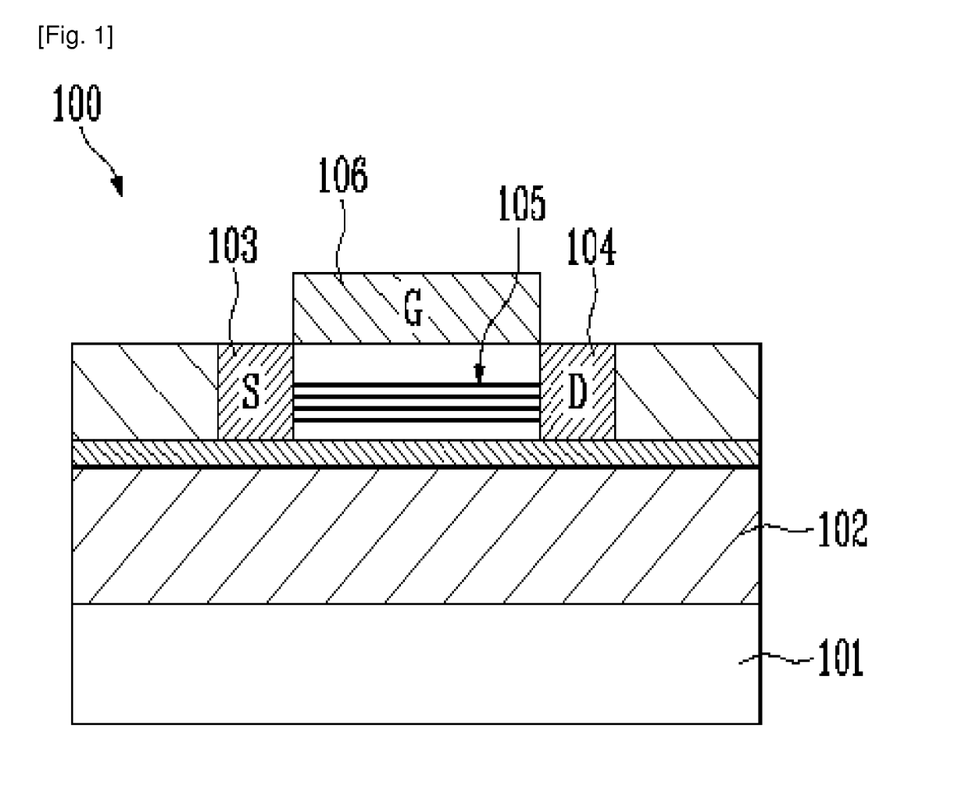
FIG. 1 illustrates a conventional electronic device using horizontal carbon nanotubes (CNTs).
Figure 2:
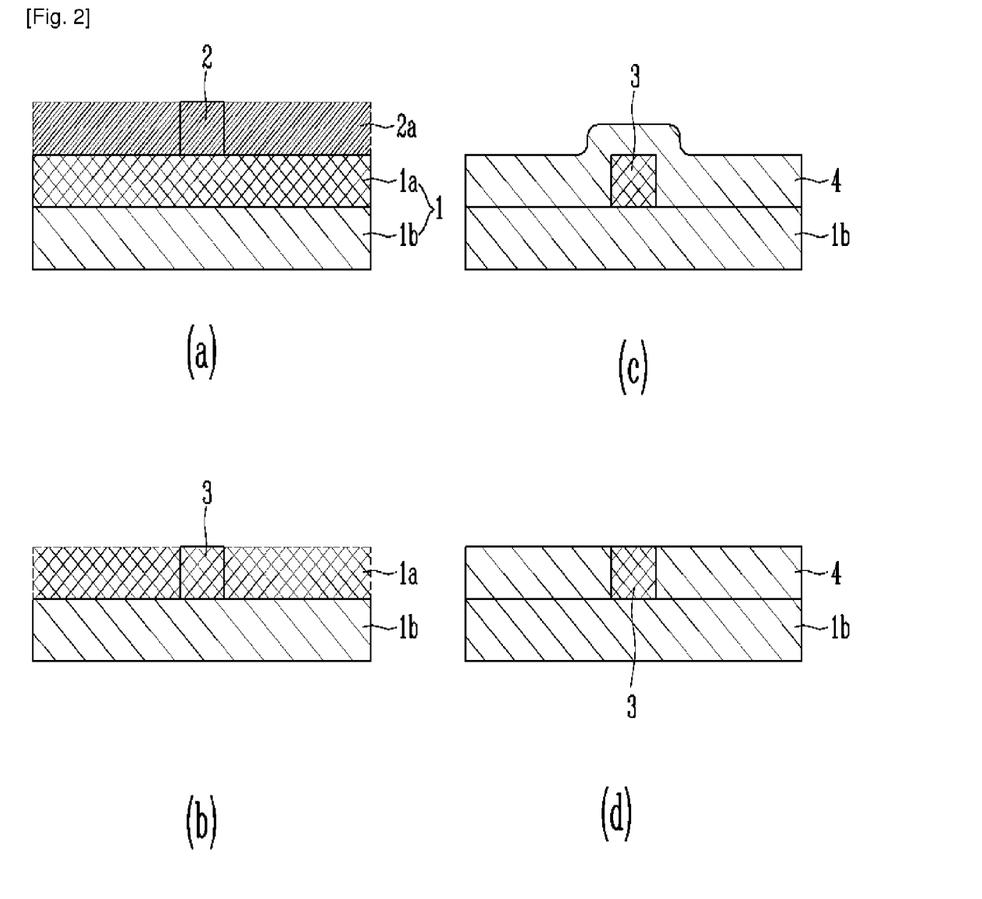

FIG. 1 illustrates a conventional electronic device using horizontal CNTs.

Referring to FIG. 1, a conventional CNT electronic device 100 includes a silicon substrate 101, an oxide 102 formed thereon, a source 103 and a drain 104 formed over the oxide 102, a CNT channel 105 formed between the source 103 and the drain 104 to horizontally connect the source 103 with the drain 104, and a gate 106 formed on the CNT channel 105.

To operate the electronic device 100 having such a structure, first, voltage has to be applied to the gate 106. If the voltage is applied to the gate 106, a current path of the CNT channel 105 is turned on, thereby operating the electronic device 100, otherwise the current path of the CNT channel 105 is turned off.

However, in manufacturing the conventional CNT electronic device, it is difficult to apply standardized CNTs which have uniform length and electrical characteristics, and it is also difficult to precisely arrange the CNTs between the silicon source and the silicon drain. While a technique using a physical adsorption characteristic has recently been used, it has also shown difficulty in uniformly arranging CNTs. Thus, it is difficult to mass-produce such devices, and defects and contamination of the devices may result.

DISCLOSURE OF INVENTION

Technical Problem

The present invention is directed to a method of manufacturing an electronic device which can arrange carbon nanotubes (CNTs) in accurate positions and improve a contact characteristic of the CNT by including a vertical CNT channel formed by a selective vertical growth technique of the CNTs.

Technical Solution

One aspect of the present invention provides a method of manufacturing an electronic device using a vertical carbon nanotube (CNT), including the steps of: (a) preparing a substrate on which a silicon source is formed; (b) forming a first insulating layer on the substrate, and etching the first insulating layer such that a top surface of the silicon source is exposed; (c) forming a second insulating layer on the silicon source, and forming a gate by patterning the second insulating layer; (d) forming a third insulating layer on the gate, and forming a through hole in which a carbon nanotube channel is to be formed by etching the third insulating layer and the second insulating layer; (e) forming a fourth insulating layer surrounding the gate on the through hole and the third insulating layer, and forming a spacer by etching the fourth insulating layer; (f) forming a metal catalyst on the silicon source; (g) vertically growing the carbon nanotube channel on the silicon source using the metal catalyst; (h) forming a fifth insulating layer on the through hole in which the carbon nanotube is formed and the third insulating layer; and (i) patterning the fifth insulating layer such that the carbon nanotube channel is exposed, and forming a silicon drain.

The substrate may be a silicon on insulator (SOI) substrate or a polycrystalline silicon substrate.

Step (c) may include the steps of: coating the second insulating layer with photoresist (PR), and patterning the PR by exposure; etching the second insulating layer using the patterned photoresist to form a gate hole, and removing the PR; forming a gate material over the second insulating layer and in the gate hole; and removing the gate material formed over the second insulating layer, except for the gate material formed in the gate hole, by etching.

Step (d) may include the steps of: coating the third insulating layer with PR, and patterning the PR by exposure; etching the second and third insulating layers to form the through hole; and removing the PR on the third insulating layer.

Step (f) may include the steps of: forming a metal catalyst particle in the air and dropping it onto the silicon source and the third insulating layer; annealing the metal catalyst particle in a vacuum; and removing the metal particles on the third insulating layer.

Step (i) may include the steps of: coating the fifth insulating layer with PR, and patterning the fifth insulating layer by exposure; etching the fifth insulating layer until an end portion of the CNT is exposed; removing the PR on the fifth insulating layer; and forming a silicon drain on the fifth insulating layer.

Step (c) may include the steps of: coating the second insulating layer with PR, and patterning the PR by exposure; etching the second insulating layer using the patterned PR to form gate holes at both sides of the silicon source, respectively, and removing the PR; and forming a gate material over the second insulating layer and in the gate hole.

Step (i) may include the steps of: coating the fifth insulating layer with PR, and patterning the fifth insulating layer by exposure; etching the fifth insulating layer until an end portion of the CNT is exposed; removing the PR on the fifth insulating layer; cleaning an etched surface of the fifth insulating layer; and forming a drain by selectively growing silicon on the etched surface.

The metal catalyst in step (g) may be one of Fe, Ni, Pt, Pd, Cu, Au and Al.

The gate material in step (c) may be one of metal, silicide, and doped silicon.

Another aspect of the present invention provides an electronic device using a vertical CNT, including: a silicon source formed on a substrate; a first insulating layer exposing a top surface of the silicon source and formed on the substrate; a second insulating layer formed on the first insulating layer and having a through hole exposing the silicon source; at least one carbon nanotube grown perpendicular to a top surface of the silicon source exposed through the through hole; at least one gate formed parallel to the growth direction of the carbon nanotube to be in contact with the through hole; and a silicon drain connected to an end portion of the carbon nanotube exposed through the through hole.

The gate may be formed of one of metal, silicide, and doped silicon.

The substrate may be an SOI substrate or a polycrystalline silicon substrate. The length of the CNT may be 50 to 250 nm.

The silicon drain may be formed by a selective silicon growth technique. The through hole in which the CNT is formed may be filled with an insulating layer.

Advantageous Effects

As described above, the present invention uses a carbon nanotube (CNT) having a vertical structure, and applies a selective silicon growth technique, thereby solving an arrangement problem of CNTs having a horizontal structure.

Also, since the CNT is formed in a vertical structure, it can realize a highly integrated device more than twice that formed in a horizontal structure, and a dual gate structure can be simply formed by disposing gates at both sides of a CNT channel.

Using a selective silicon growth technique, the CNTs can be connected to each other, thereby simplifying processes, improving a contact characteristic, and increasing reliability of the process of manufacturing an electronic device using CNTs to increase a ripple effect on related technology in the future.

BRIEF DESCRIPTION OF THE DRAWINGS

FIGS. 2A to 5D are cross-sectional views illustrating a process of manufacturing an electronic device according to an exemplary embodiment of the present invention.

FIG. 6A to 6C are cross-sectional views illustrating a process of manufacturing a dual gate electronic device according to another exemplary embodiment of the present invention.

DESCRIPTION OF MAJOR SYMBOLS IN THE ABOVE FIGURES

1: Substrate
1a: Silicon layer
1b: Lower insulating layer
2, 6, 9, 15 and 17: PR pattern
3: Silicon source
4: First insulating layer
5: Second insulating layer
5a and 8a: Contact hole
6a, 9a and 17a: Opening
7: Gate
7a: Gate material
8: Third insulating layer
10: Fourth insulating layer
11: Spacer
12: Metal catalyst particle
13: Carbon nanotube
14: Fifth insulating layer
16: Silicon drain
18: Silicon drain formed by selective silicon growth

MODE FOR THE INVENTION

Hereinafter, a method of manufacturing an electronic device using a vertical carbon nanotube (CNT) channel according to the present invention will be described with reference to the accompanying FIGS. 2A to 5D.

FIGS. 2A to 5D are cross-sectional views illustrating a process of manufacturing a vertical CNT electronic device according to an exemplary embodiment of the present invention.

Referring to FIG. 2A, to manufacture an electronic device including a vertical CNT channel, a substrate 1 is first prepared.

The substrate 1 is usually a silicon on insulator (SOI) substrate in which a silicon layer 1a is formed on a lower insulating layer 1b. However, the substrate 1 can be a polycrystalline silicon substrate formed by thermally oxidizing a silicon surface. The lower insulating layer 1b may be formed of oxide or nitride.

Then, a photoresist (PR) 2a is coated on the substrate 1 and patterned by exposure and patterning to form a PR pattern 2 for forming a silicon source.

Referring to FIG. 2B, the silicon layer 1a is etched using the patterned PR 2, thereby forming a silicon source 3. To etch the silicon layer 1a, a dry etching process is used, and an ashing process is performed to remove the PR pattern 2. In this embodiment, $O_2$ ashing is used. The patterned silicon source 3 has a height and width of 10 to 100 nm, respectively.

Then, referring to FIG. 2C, a first insulating layer 4 is formed on the substrate 1 having the silicon source 3. The first insulating layer 4 may be formed of oxide or nitride to cover the entire silicon source 3.

Referring to FIG. 2D, the first insulating layer 4 formed to cover the silicon source 3 is etched, thereby exposing a top surface of the silicon source 3. Here, the first insulating layer 4 is removed by blanket etching or chemical mechanical polishing (CMP).

Figure 3:
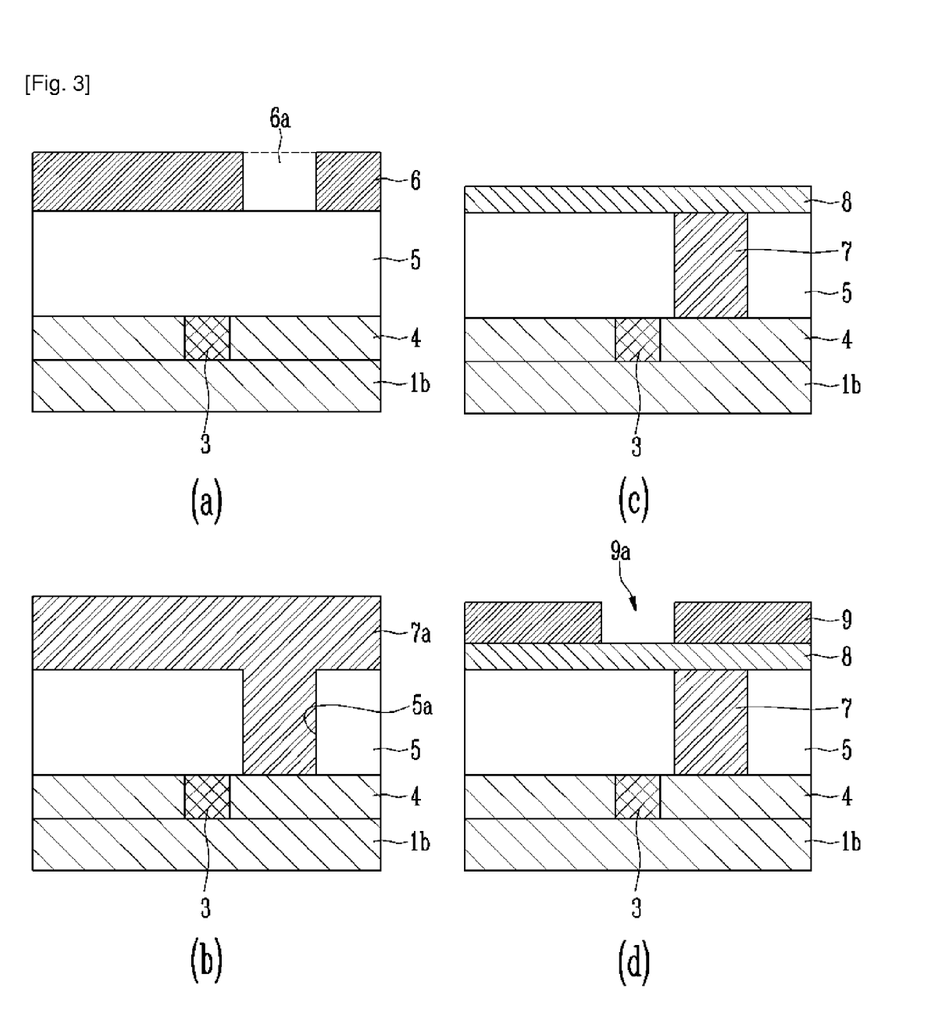

Referring to FIGS. 3A and 3B, a second insulating layer 5 may be formed to a thickness of 20 to 200 nm on the first insulating layer 4 having the silicon source 3 whose top surface is exposed. The second insulating layer 5 is formed using an oxide layer having good vertical etchability by high density plasma (HDP) deposition, or by flowing a coated boro-phospho silicate glass (BPSG) layer. A photoresist (PR) 6 is coated on the second insulating layer 5, and then patterned to form an opening 6a for forming a gate electrode. Here, the opening 6a for forming a gate electrode may have a width of 10 to 100 nm.

A contact hole 5a is formed in the second insulating layer 5 using the PR pattern 6 having the opening 6a as an etch mask by dry etching. Here, if the first insulating layer 4 is different from the second insulating layer 5 (for example, the first insulating layer is a nitride layer, and the second insulating layer is an oxide layer), the first insulating layer 4 is not affected during the etching of the second insulating layer 5. However, if both the insulating layers 4 and 5 are formed of the same material, the first insulating layer 4 may get damaged during the etching of the second insulating layer 5, so the second insulating layer 5 is etched by dry etching having a high etch selectivity in order not to damage the first insulating layer 4.

After forming the contact hole 5a, the PR pattern 6 formed on the second insulating layer 5 is removed. Then, a gate material 7a is formed on the contact hole 5a and the second insulating layer 5. The gate material 7a may be one of metal (tungsten (W), a W alloy, etc.), silicide (W-silicide, nickel (Ni)-silicide, etc.) and doped silicon.

In the next step, referring to FIG. 3C, a gate 7 is formed by removing the gate material 7a formed on the second insulating layer 5, except for the gate material 7a in the contact hole 5a, by blanket-etching or CMP. After removal of the gate material 7a, a third insulating layer 8 is deposited on the second insulating layer 5. The third insulating layer 8 may be formed of oxide or nitride.

Figure 4:
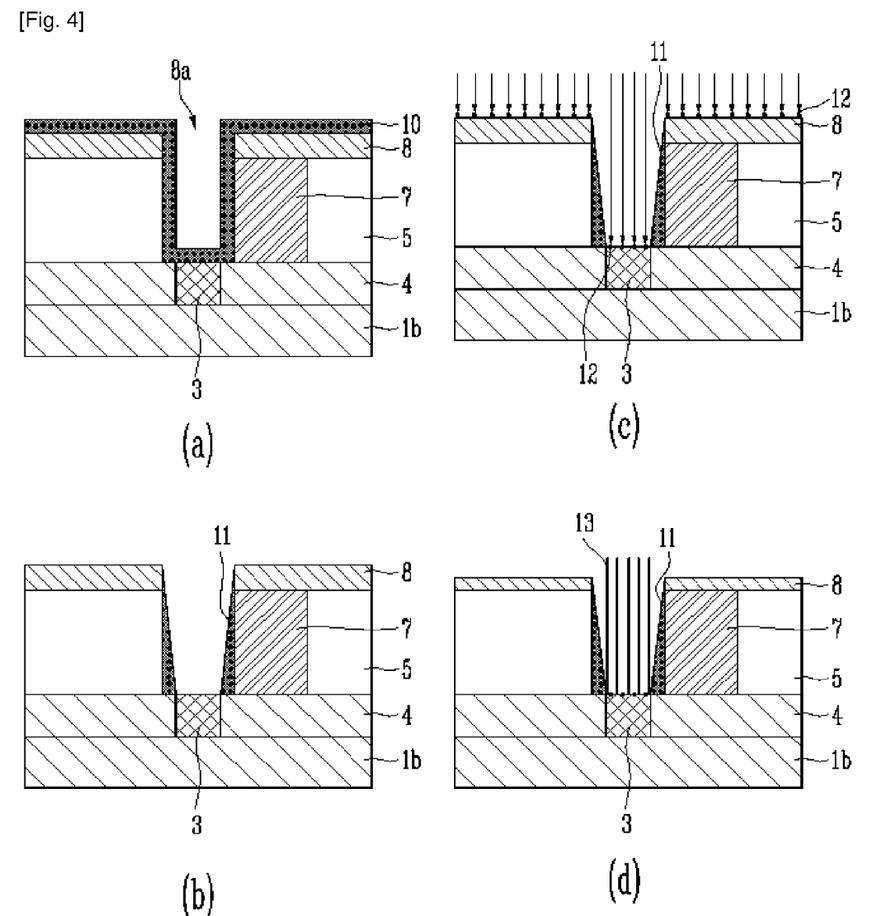

Referring to FIGS. 3D and 4A, a PR pattern 9 having an opening 9a is formed on the third insulating layer 8. The opening 9a is formed to be spaced apart from the gate 7, and the third insulating layer 8 and the second insulating layer 5 are dry-etched using the PR pattern 9 having the opening 9a, thereby forming a contact hole 8a. Here, only the third insulating layer 8 and the second insulating layer 5 are etched not to damage the silicon source 3. Then, a fourth insulating layer 10 having good step coverage is formed on the exposed silicon source 3 and the third insulating layer 8. The fourth insulating layer 10 may be formed to a thickness of 5 to 50 nm using a nitride layer or an oxide layer.

Referring to FIG. 4B, the fourth insulating layer 10 is etched to form a spacer 11. The spacer 11 may be formed to a thickness of 2 to 20 nm not to expose the gate 7. After that, a cleaning process is performed to remove etching damage to the silicon source due to etching, because the etching damage may affect contact characteristics between the CNT and silicon.

FIG. 4C is a cross-sectional view illustrating a process of forming a metal catalyst particle. The metal catalyst particle 12 may be formed of metal such as iron (Fe), nickel (Ni), platinum (Pt), palladium (Pd), copper (Cu), gold (Au) or aluminum (Al), and may have a diameter of 2 to 20 nm. The metal catalyst particle is formed in the air and then dropped onto the substrate. After that, the particle is annealed in a vacuum at a temperature of 500° C. or less, and thus the metal catalyst particle 12 and the silicon source 3 are strongly bonded to each other. Here, if the annealing is performed at too high a temperature or for too long a time, the metal catalyst particle 12 can penetrate into the silicon. After annealing the metal catalyst particle 12 and the silicon source 3, an ultra-sonic cleaning or laser shock cleaning process is performed to remove the metal catalyst particles 12 from the third insulating layer 8.

Referring to FIG. 4D, a CNT 13 is vertically grown after leaving the metal catalyst particle 12 only on the silicon source 3. The CNT 13 may be 50 to 250 nm long, and may be grown to be a single wall CNT (SWCNT). The CNT growth methods (which include chemical vapor deposition (CVD), vapor phase growth, plasma enhanced chemical vapor deposition (PECVD), arc-discharging and laser deposition) may have a slow growth rate and precisely control the CNT's length.

Referring to FIG. 5A, after growing the CNT 13, the spacer 11 is removed by etching, and a fifth insulating layer 14 having good step coverage is formed. The fifth insulating layer 14 may be formed of oxide or nitride. Then, to form a silicon drain connected with the CNT 13, a photoresist (PR) 15 is coated on the fifth insulating layer 14 and then patterned.

Referring to FIG. 5B, the fifth insulating layer 14 is etched to expose an end portion of the CNT 13 vertically formed, and the PR pattern 15 is removed.

Referring to FIG. 5C, a silicon drain 16 is deposited on the fifth insulating layer 14 to be connected with the CNT 13.

Referring to FIG. 5D, the silicon on the fifth insulating layer 14 is removed by blanket-etching or CMP.

The method of manufacturing a vertical CNT electronic device has been described with reference to FIGS. 2A to 5D, according to an exemplary embodiment of the present invention. A method according to another exemplary embodiment of the present invention will now be described with reference to FIGS. 6A to 6C, and FIG. 7.

Figure 6:
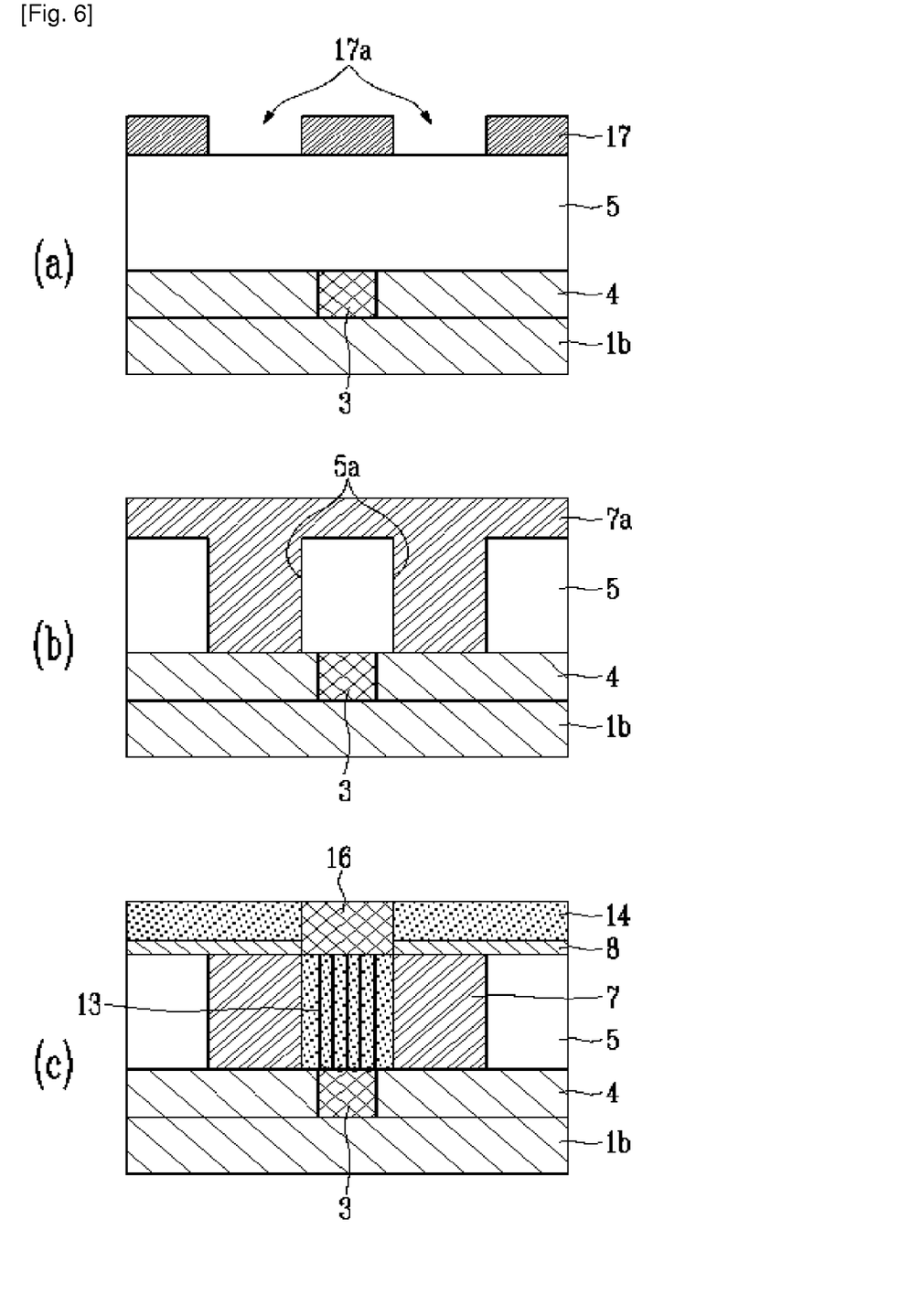

FIGS. 6A to 6C are cross-sectional views illustrating a process of manufacturing a vertical CNT electronic device having a dual gate.

Referring to FIG. 6A, instead of a PR process for forming one gate such as that in FIG. 3A, a PR patterning process 17 is performed to form an opening 17a, thereby forming two gates at both sides of the silicon source.

Next, referring to FIG. 6B, a contact hole 5a is formed in a second insulating layer 5 using the PR pattern 17 by dry etching, as illustrated in FIG. 3B, and then is filled with a gate material 7a.

Other processes are the same as those illustrated in FIGS. 2A to 2D and 3C to 5D, and thus may be analogized therefrom.

FIG. 6C illustrates a completed vertical CNT electronic device having a dual gate.

Figure 7:
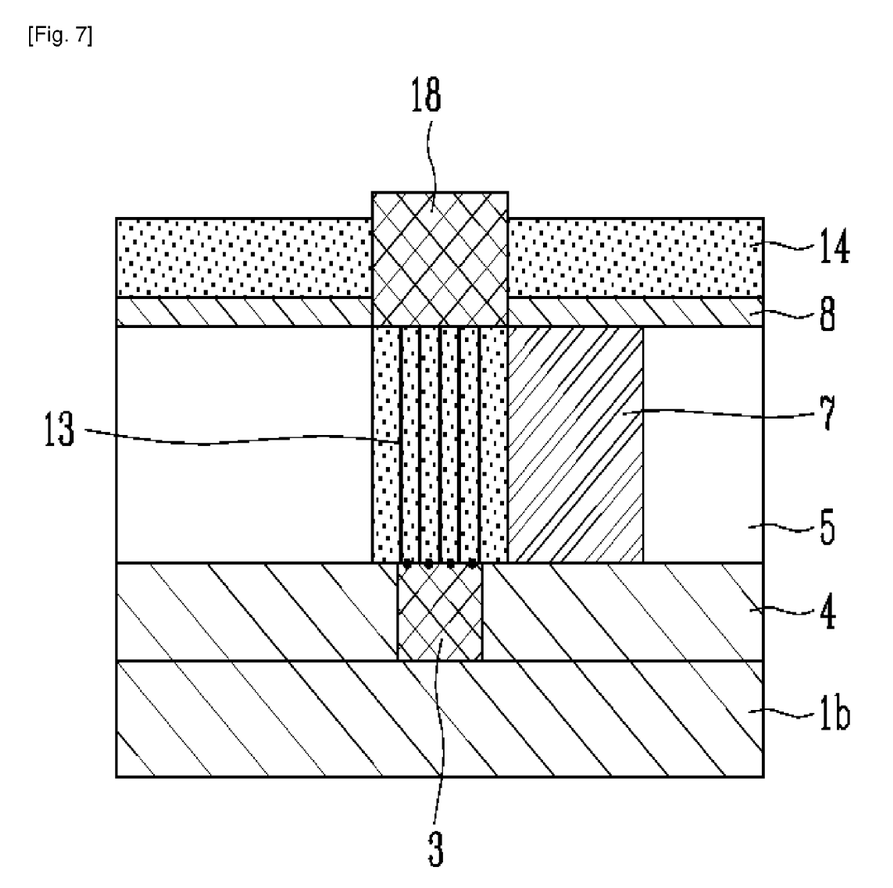
FIG. 7 illustrates a silicon drain formed by selective silicon growth.

FIG. 7 illustrates a drain formed by a selective silicon growth technique.

Figure 5:
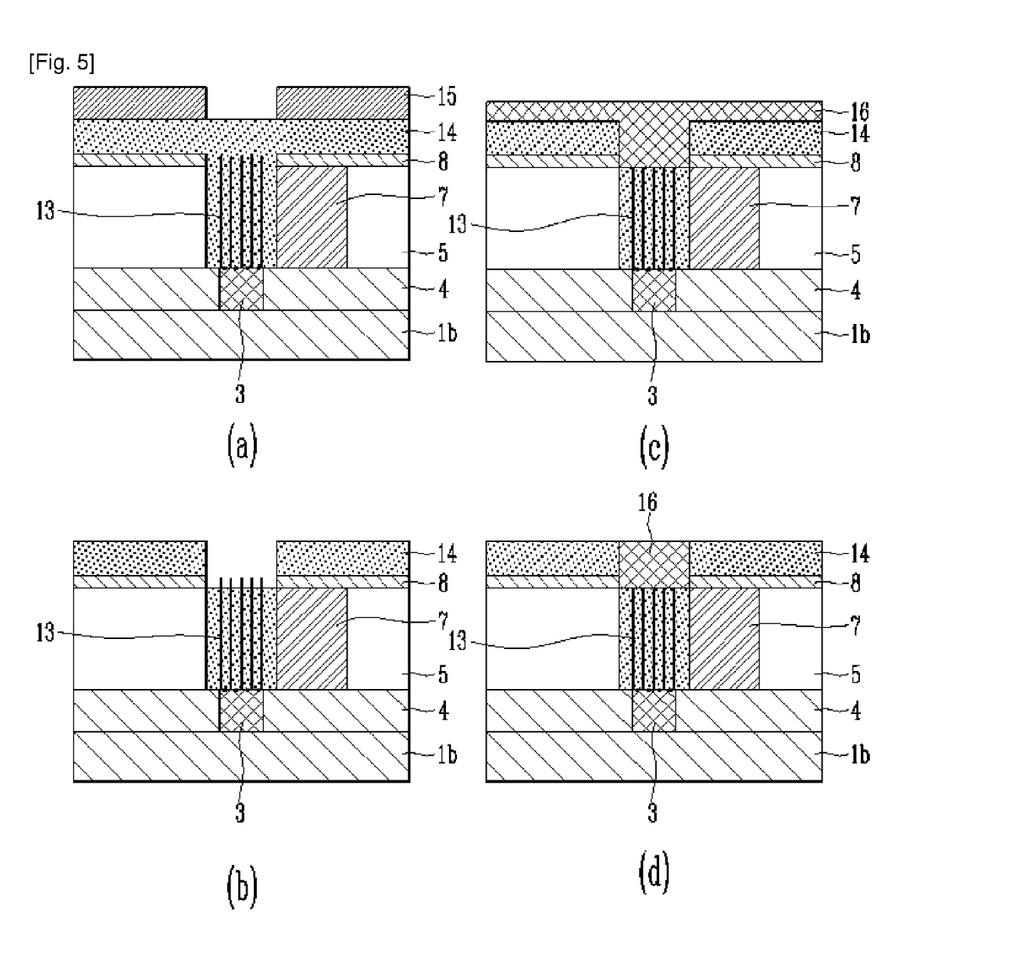

After the process is completed with reference to FIGS. 2A to 5A, a fifth insulating layer 14 is etched, cleaned and then grown by the selective silicon growth technique as illustrated in FIG. 5B. In the selective silicon growth technique, the process of blanket-etching a silicon thin film after forming the silicon thin film may be omitted. Since the CNT is a conductor, a drain 18 can be filled with silicon by the selective silicon growth.

While the invention has been shown and described with reference to certain exemplary embodiments thereof, it will be understood by those skilled in the art that various changes in form and details may be made therein without departing from the spirit and scope of the invention as defined by the appended claims.

The invention claimed is:

1. A method of manufacturing an electronic device using a vertical carbon nanotube, comprising the steps of:
   (a) preparing a substrate on which a silicon source is formed;
   (b) forming a first insulating layer on the substrate, and etching the first insulating layer such that a top surface of the silicon source is exposed;
   (c) forming a second insulating layer on the silicon source, and forming a gate by patterning the second insulating layer;
   (d) forming a third insulating layer on the gate, and forming a through hole in which a carbon nanotube channel is to be formed by etching the third insulating layer and the second insulating layer;
   (e) forming a fourth insulating layer surrounding the gate on the through hole and the third insulating layer, and forming a spacer by etching the fourth insulating layer;
   (f) forming a metal catalyst on the silicon source;

(g) vertically growing the carbon nanotube channel on the silicon source using the metal catalyst;

(h) forming a fifth insulating layer on the through hole in which the carbon nanotube channel is formed and the third insulating layer; and (i) patterning the fifth insulating layer such that the carbon nanotube channel is exposed, and forming a silicon drain at the carbon nanotube channel exposed region, wherein the carbon nanotube channel is connected between the silicon source and the silicon drain.

2. The method according to claim 1, wherein the substrate is a silicon on insulator (SOI) substrate or a polycrystalline silicon substrate.

3. The method according to claim 1, wherein step (c) comprises the steps of:
coating the second insulating layer with photoresist and patterning the photoresist by exposure;
etching the second insulating layer using the patterned photoresist to form a gate hole, and removing the photoresist;
depositing a gate material over the second insulating layer and in the gate hole; and
removing the gate material deposited over the second insulating layer, except for the gate material deposited in the gate hole, by etching.

4. The method according to claim 1, wherein step (d) comprises the steps of:
coating the third insulating layer with photoresist, and patterning the photoresist by exposure;
etching the second and third insulating layers to form the through hole; and
removing the photoresist on the third insulating layer.

5. The method according to claim 1, wherein step (f) comprises the steps of:
forming a metal catalyst particle in the air, and dropping the metal catalyst particle onto the silicon source and the third insulating layer;
annealing the metal catalyst particle in a vacuum; and
removing the metal catalyst particles on the third insulating layer.

6. The method according to claim 1, wherein step (i) comprises the steps of:
coating the fifth insulating layer with photoresist, and patterning the fifth insulating layer by exposure;
etching the fifth insulating layer until an end portion of the carbon nanotube channel is exposed;
removing the photoresist on the fifth insulating layer; and
forming a silicon drain on the fifth insulating layer.

7. The method according to claim 1, wherein step (c) comprises the steps of:
coating the second insulating layer with photoresist, and patterning the photoresist by exposure;
etching the second insulating layer using the patterned photoresist to form gate holes at both sides of the silicon source, respectively, and removing the photoresist; and
depositing a gate material over the second insulating layer and in the gate hole.

8. The method according to claim 1, wherein step (i) comprises the steps of:
coating the fifth insulating layer with photoresist, and patterning the fifth insulating layer by exposure;
etching the fifth insulating layer until an end portion of the carbon nanotube channel is exposed;
removing the photoresist on the fifth insulating layer;
cleaning an etched surface of the fifth insulating layer; and
forming a drain by selectively growing silicon on the etched surface.

9. The method according to claim 1, wherein the metal catalyst in step (g) is one of Fe, Ni, Pt, Pd, Cu, Au and Al.

10. The method according to claim 1, wherein the gate material in step (c) is one of metal, silicide, and doped silicon.

11. An electronic device having a vertical carbon nanotube, comprising:
a silicon source formed on a substrate;
a first insulating layer exposing a top surface of the silicon source and formed on the substrate;
a second insulating layer formed on the first insulating layer and having a through hole exposing the silicon source;
at least one carbon nanotube perpendicularly grown from a top surface of the silicon source exposed by the through hole;
at least one gate formed parallel to the growth direction of the carbon nanotube to be in contact with the through hole;
a third insulating layer filled in the through hole in which the carbon nanotube is formed; and
a silicon drain formed on the through hole in which the carbon nanotube and the third insulating layer are formed and connected to an end portion of the carbon nanotube,
wherein the carbon nanotube is connected between the silicon source and the silicon drain.

12. The device according to claim 11, wherein the gate is formed of one of metal, silicide, and doped silicon.

13. The device according to claim 11, wherein the substrate is an SOI substrate or a polycrystalline silicon substrate.

14. The device according to claim 11, wherein the length of the carbon nanotube ranges from 50 to 250 nm.

15. The device according to claim 11, wherein the silicon drain is formed by selectively growing silicon.

16. The method according to claim 1, wherein one end of the carbon nanotube channel is in direct contact with the silicon source and the other end of the carbon nanotube channel is in direct contact with the silicon drain.

17. The device according to claim 11, wherein one end of the carbon nanotube is in direct contact with the silicon source and the other end of the carbon nanotube is in direct contact with the silicon drain.

18. The device according to claim 11, wherein the carbon nanotube extends in a direction perpendicular to a direction in which the substrate extends.

19. The device according to claim 11, wherein the carbon nanotube extends in a direction perpendicular to a direction in which the substrate extends, with one end of the carbon nanotube being in direct contact with the silicon source and the other end of the carbon nanotube being in direct contact with the silicon drain.

* * * * *